United States Patent [19]
Wright et al.

[11] Patent Number: 5,788,635
[45] Date of Patent: *Aug. 4, 1998

[54] ADAPTIVE PERSISTENCE PROCESSING

[75] Inventors: J. Nelson Wright, Menlo Park; Jay Sterling Plugge, Sunnyvale; D. Grant Fash, III, Saratoga; Donald R. Langdon, Mountain View; David J. Finger, San Jose; Brian M. Normand, San Ramon; Ismayil M. Guracar, Redwood City, all of Calif.

[73] Assignee: Acuson Corporation, Mountain View, Calif.

[ * ] Notice: The term of this patent shall not extend beyond the expiration date of Pat. No. 5,595,179.

[21] Appl. No.: 783,928

[22] Filed: Jan. 17, 1997

Related U.S. Application Data

[63] Continuation of Ser. No. 433,217, May 2, 1995, Pat. No. 5,595,179.
[51] Int. Cl.$^6$ .................................................. A61B 8/00
[52] U.S. Cl. ............................................ 600/437; 600/443
[58] Field of Search .................. 128/660.01, 660.07, 128/661.01, 661.09; 348/447–448; 382/50, 59, 265; 600/437, 443, 447, 455

[56] References Cited

U.S. PATENT DOCUMENTS

| | | |
|---|---|---|
| 3,690,153 | 9/1972 | Matay . |
| 4,043,181 | 8/1977 | Nigam . |

(List continued on next page.)

FOREIGN PATENT DOCUMENTS

| | | |
|---|---|---|
| 1329733 | 5/1963 | France . |
| 1534366 | 7/1976 | United Kingdom . |

OTHER PUBLICATIONS

Claesson et al., "Frequency –and Depth –Dependent Compensation of Ultrasonic Signals," *IEEE Trans. On Ultrasonics, Ferro, and Freq. Control*, Sep. 1988.

DeClercq, et al., "Adaptive Gain Control for Dynamic Ultrasound Imaging," 1975 *Ultrasonics Symposium Proceedings*, pp. 59–63.

(List continued on next page.)

*Primary Examiner*—Francis Jaworski
*Attorney, Agent, or Firm*—Brinks Hofer Gilson & Lione; Craig A. Summerfield

[57] ABSTRACT

The invention provides a method and system for adaptive persistence processing in an ultrasound imaging system. Acoustic signals are temporally filtered using an adaptive persistence filter, having a recursive stage followed by a nonrecursive stage. A set of filtering coefficients for each stage are supplied by a look-up table in a memory, addressed or indexed in response to a plurality of input or output pixel values. The look-up table may therefore embody any selected function of its input variables. The input variables for the look-up table function are a current input pixel value $X_n$ and a previous intermediate pixel value $W_{n-1}$, and the function embodied by the look-up table includes a relative first difference function for selecting a filter coefficient. A recursive filtering coefficient $\alpha$ is held constant over time, while a nonrecursive filtering coefficient $\gamma$ is adjusted dynamically in response to the current input pixel value $X_n$ and the previous intermediate pixel value $W_{n-1}$. The non-recursive stage filter has a frequency response that attenuates higher frequency components without attenuating a broad range of lower frequency components, relative to the recursive stage frequency response. The step response or settling time of the non-recursive stage filter always spans one frame interval, independent of the nonrecursive filtering coefficient, while the step response or settling time for the recursive stage filter is generally longer and is dependent on the recursive filtering coefficient.

50 Claims, 11 Drawing Sheets

U.S. PATENT DOCUMENTS

| | | | |
|---|---|---|---|
| 4,176,658 | 12/1979 | Kossoff et al. | |
| 4,356,731 | 11/1982 | Mahony | |
| 4,389,893 | 6/1983 | Ophir et al. | |
| 4,408,492 | 10/1983 | Kossoff et al. | |
| 4,441,368 | 4/1984 | Flax | |
| 4,452,085 | 6/1984 | Pelc et al. | |
| 4,470,303 | 9/1984 | O'Donnell | |
| 4,475,398 | 10/1984 | Tjornehoj et al. | |
| 4,475,400 | 10/1984 | Flax | |
| 4,513,621 | 4/1985 | Renzel et al. | |
| 4,569,353 | 2/1986 | Ferrari | |
| 4,590,582 | 5/1986 | Umemura | 364/724 |
| 4,662,380 | 5/1987 | Riley | |
| 4,727,506 | 2/1988 | Fling | 364/745 |
| 4,750,367 | 6/1988 | Bernatets | |
| 4,751,846 | 6/1988 | Dousse | |
| 4,785,818 | 11/1988 | Hardin | |
| 4,786,818 | 11/1988 | Mead et al. | |
| 4,817,617 | 4/1989 | Takeuchi et al. | |
| 4,852,576 | 8/1989 | Inbar et al. | |
| 4,887,306 | 12/1989 | Hwang et al. | |
| 5,060,515 | 10/1991 | Kanda et al. | |
| 5,107,841 | 4/1992 | Sturgill | |
| 5,113,706 | 5/1992 | Pittaro | |
| 5,152,292 | 10/1992 | Karp | 600/443 |
| 5,153,711 | 10/1992 | DesJardins | 358/22 |
| 5,226,420 | 7/1993 | Peterson | |
| 5,249,548 | 10/1993 | Dupuy | |
| 5,271,404 | 12/1993 | Corl et al. | |
| 5,287,753 | 2/1994 | Routh et al. | |
| 5,301,168 | 4/1994 | Miller | |
| 5,301,674 | 4/1994 | Erikson et al. | |
| 5,313,948 | 5/1994 | Murashita et al. | |
| 5,392,211 | 2/1995 | Oe | 364/413.14 |
| 5,467,770 | 11/1995 | Smith et al. | |
| 5,476,096 | 12/1995 | Olstad et al. | |
| 5,479,926 | 1/1996 | Ustuner et al. | |
| 5,495,846 | 3/1996 | Uehara et al. | |
| 5,531,224 | 7/1996 | Ellis et al. | 600/443 |
| 5,595,179 | 1/1997 | Wright et al. | 128/660.07 |

OTHER PUBLICATIONS

Janssen et al., "Adaptive Interpolation of Discrete–Time Signals That Can Be Moldeled as Autoregressive Processes," *IEEE Trans. On Acoustics, Speech and Signal Processing*, Apr. 1986, pp. 317–330.

Kristoffersen et al., "A Time–Shared Ultrasound Doppler Measurement and 2–D Imaging System," *IEEE Trans. On Biomedical Engineering*, May 1988, pp. 285–295.

Kuc, "Ultrasonic Tissue Characterization Using Kurtosis," *IEEE Trans. On Ultrasonics, Ferro, and Freq. Control*, May 1986.

Ophir et al., "Digital Scan Converters in Diagnostic Ultrasound Imaging," *Proc. of the IEEE*, Apr., 1979, pp. 654–663.

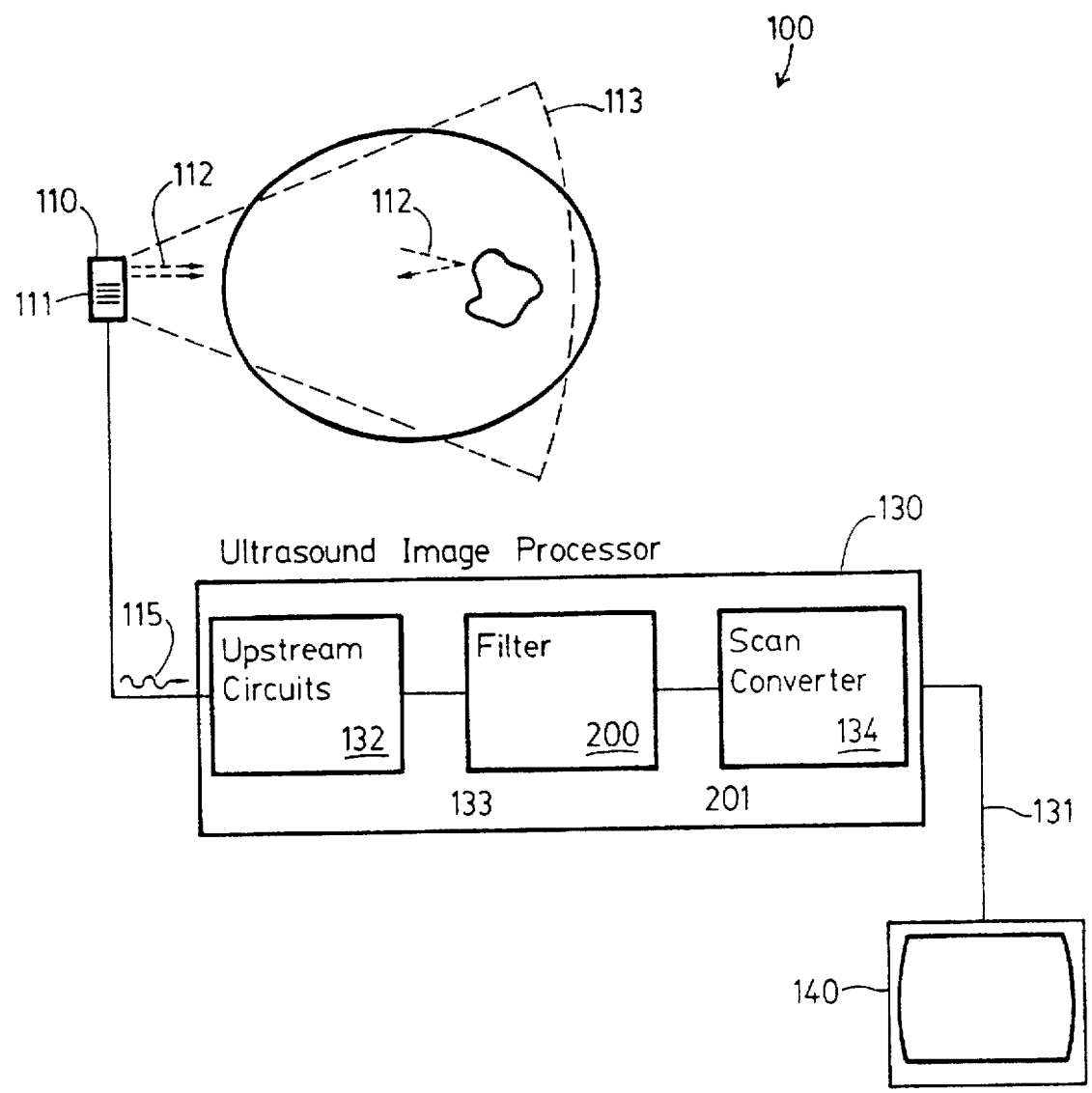
FIG._1.

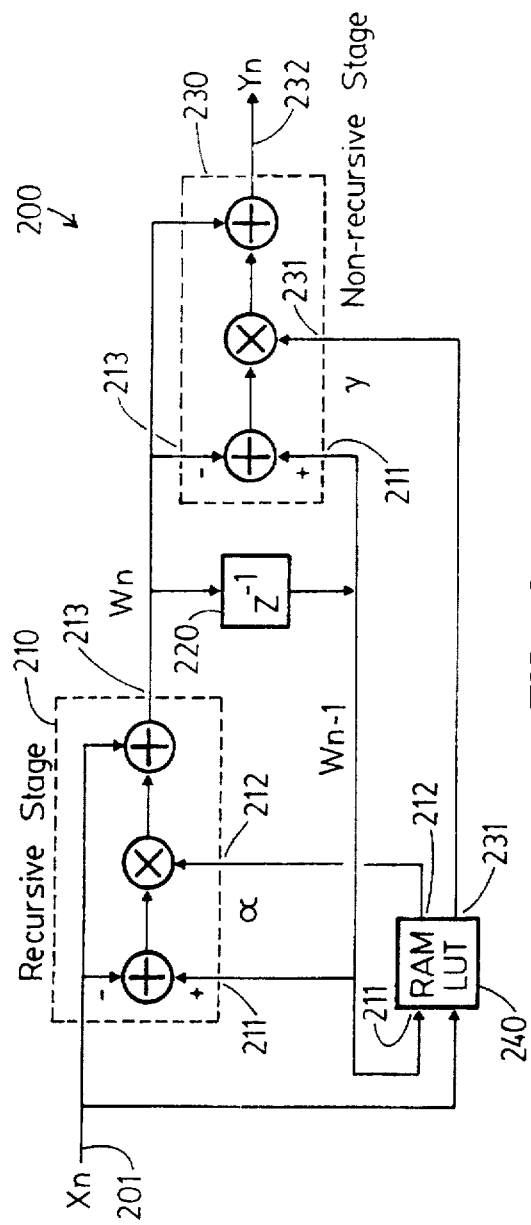
FIG._2.
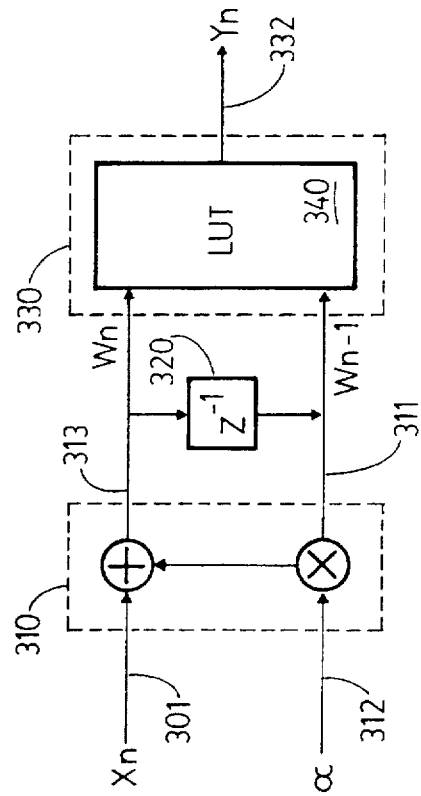
FIG._3.

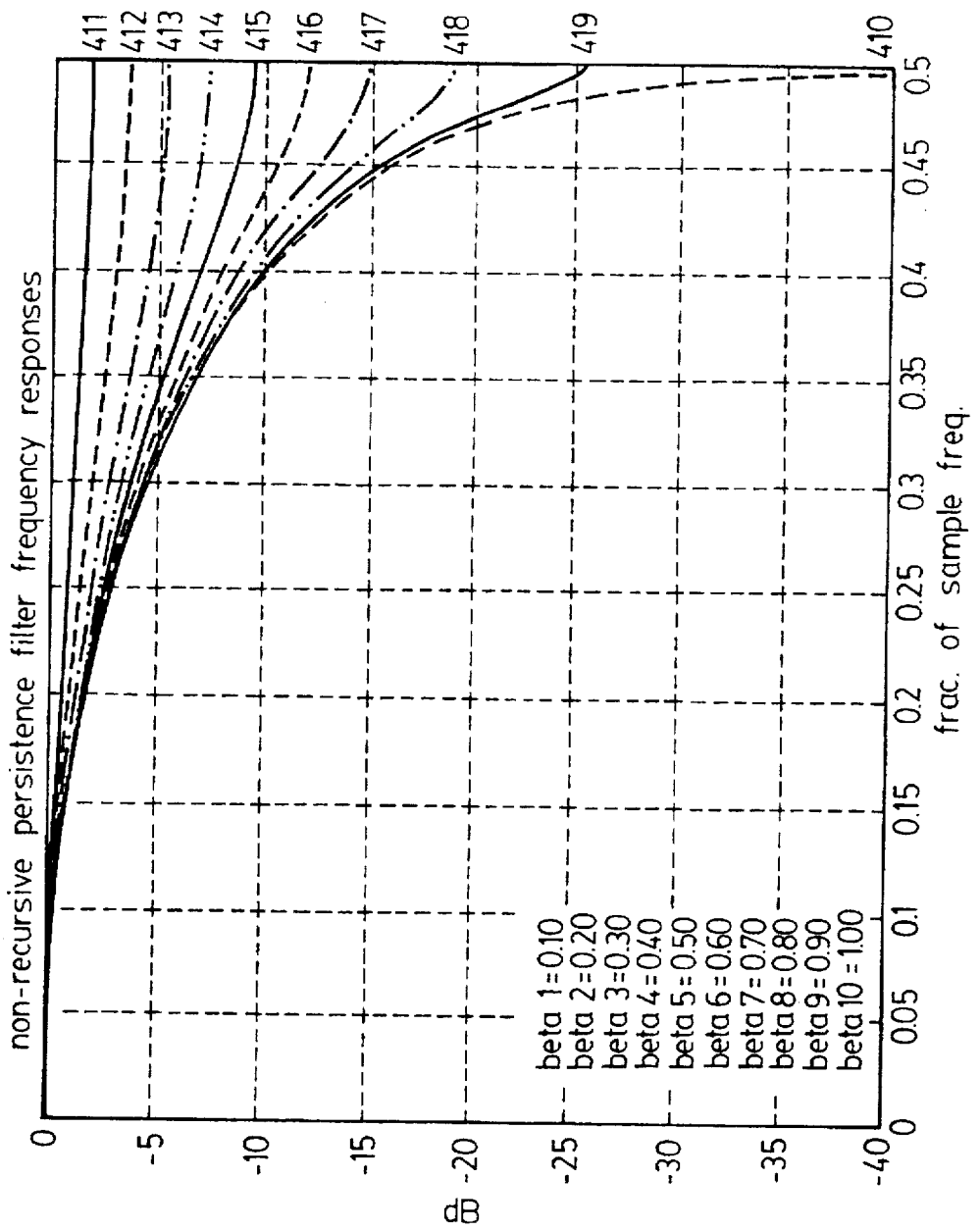
FIG._4A.

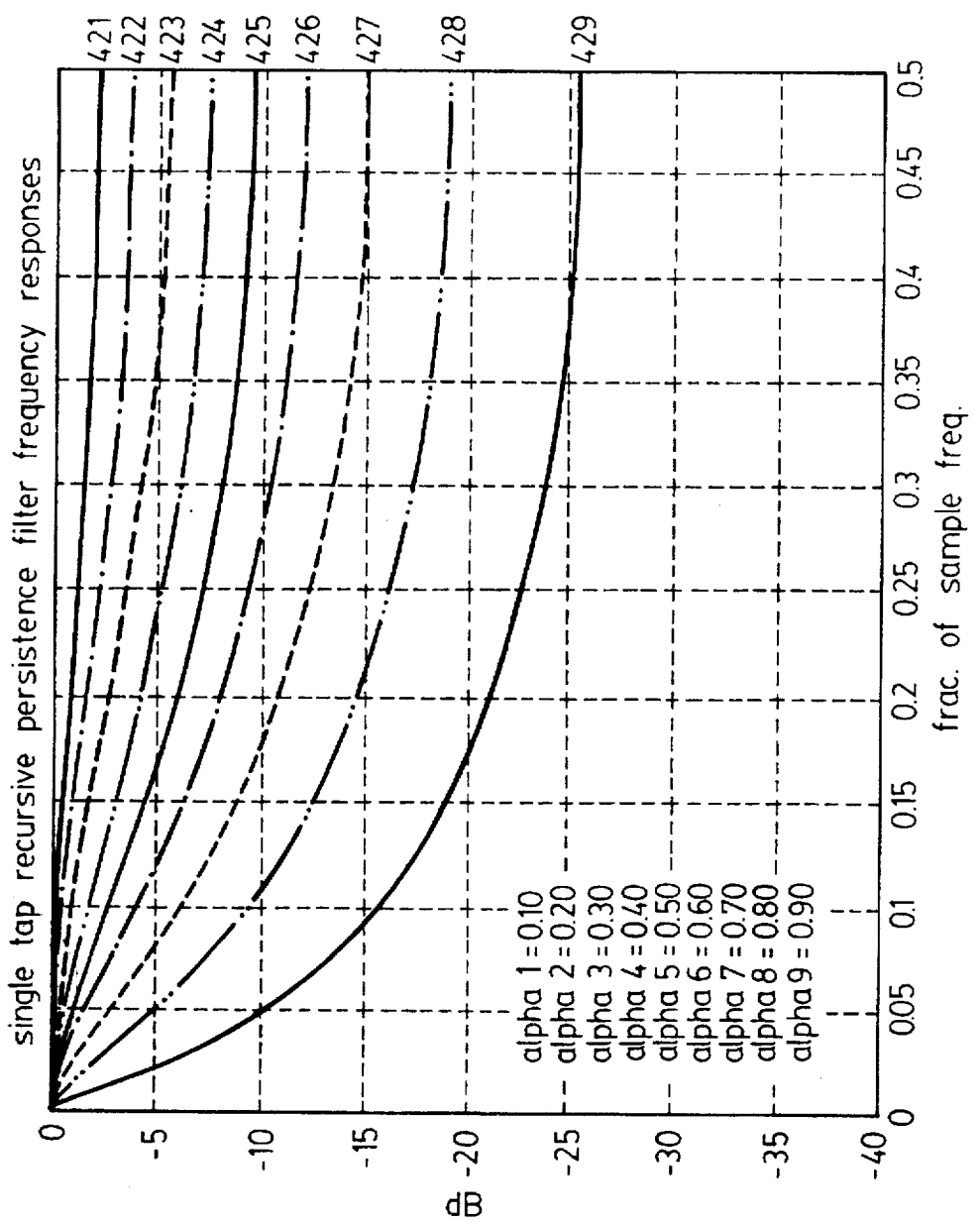
FIG._4B.

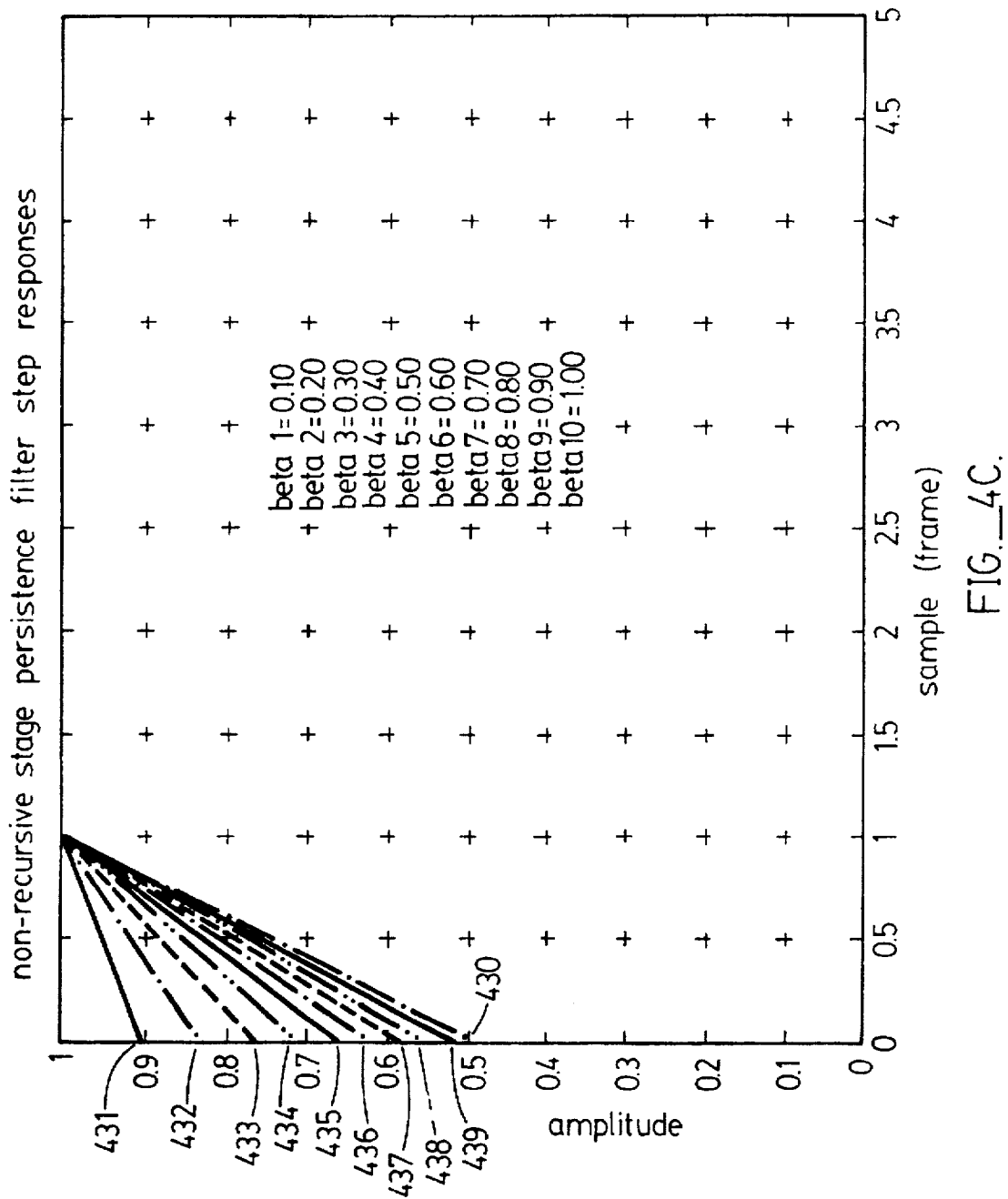
FIG._4C.

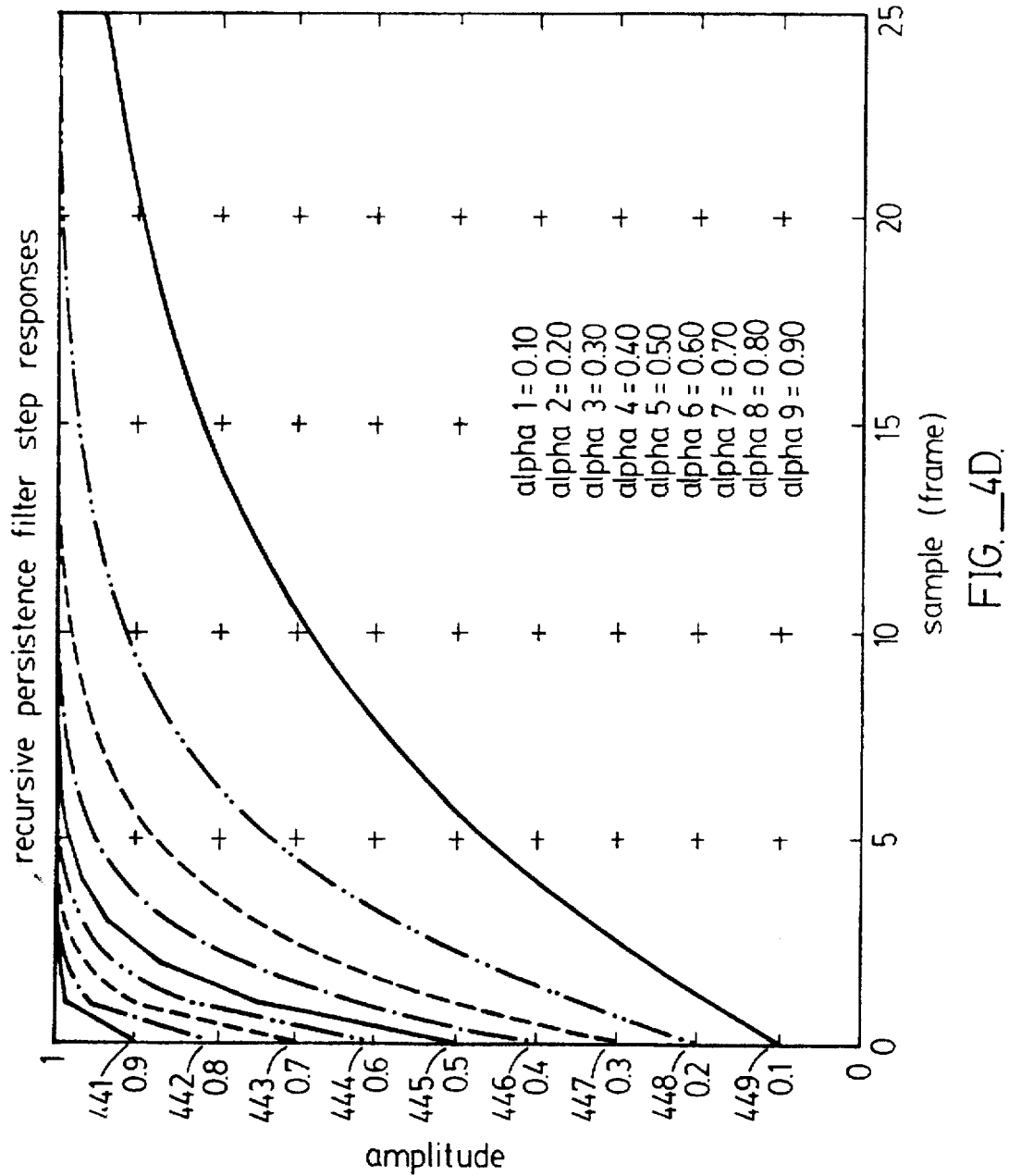
FIG._4D.

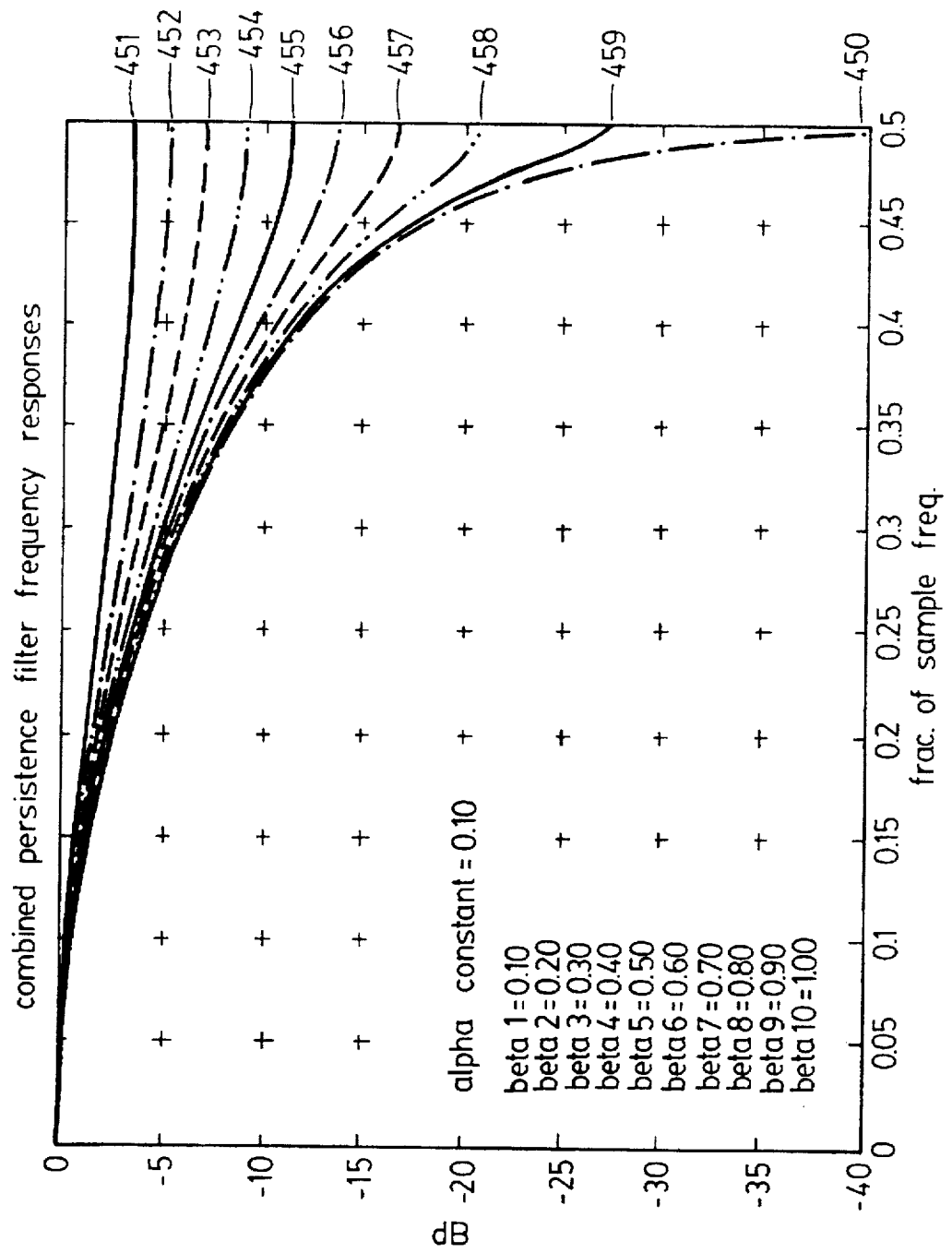
FIG._4E.

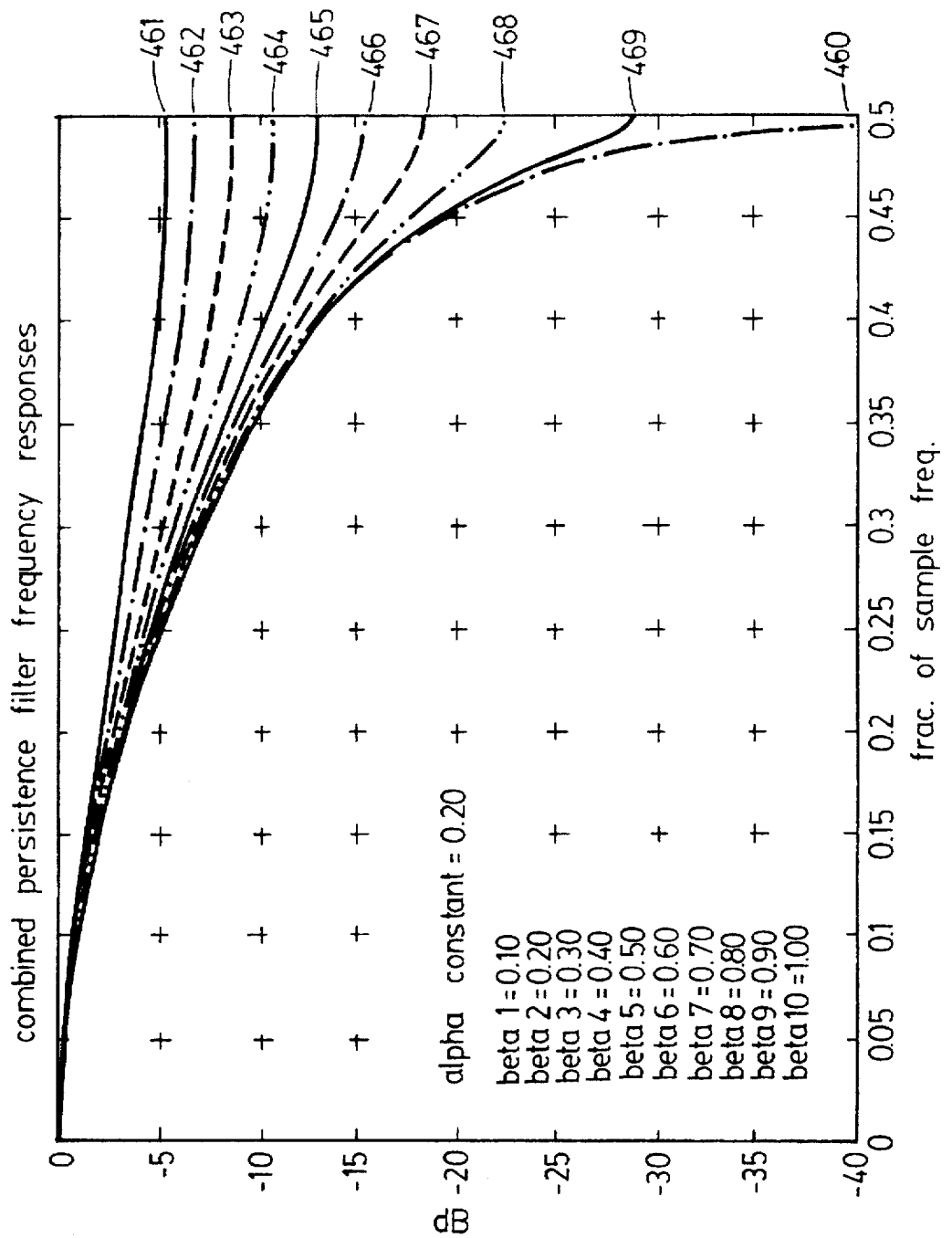
FIG._4F.

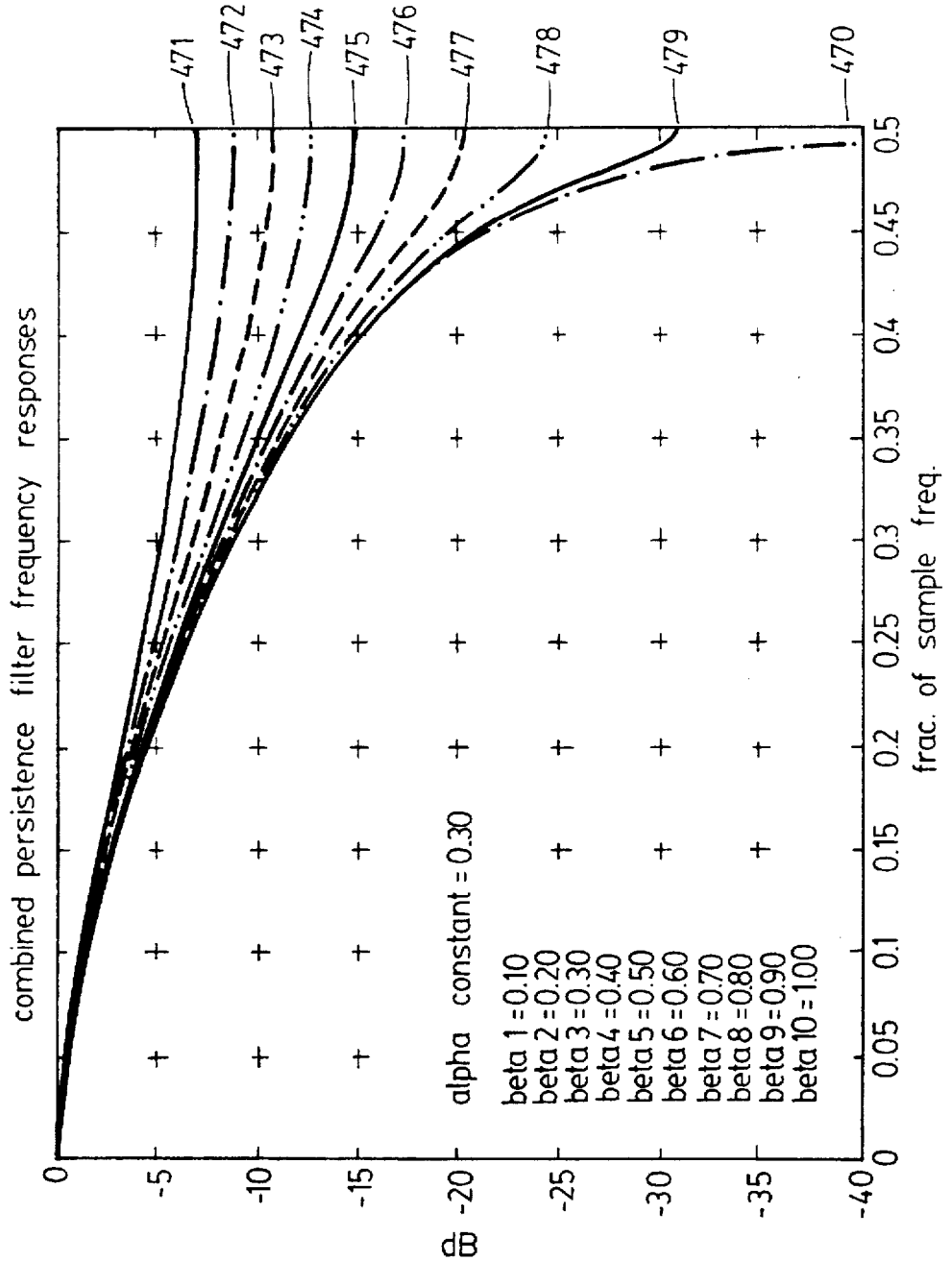
FIG._4G.

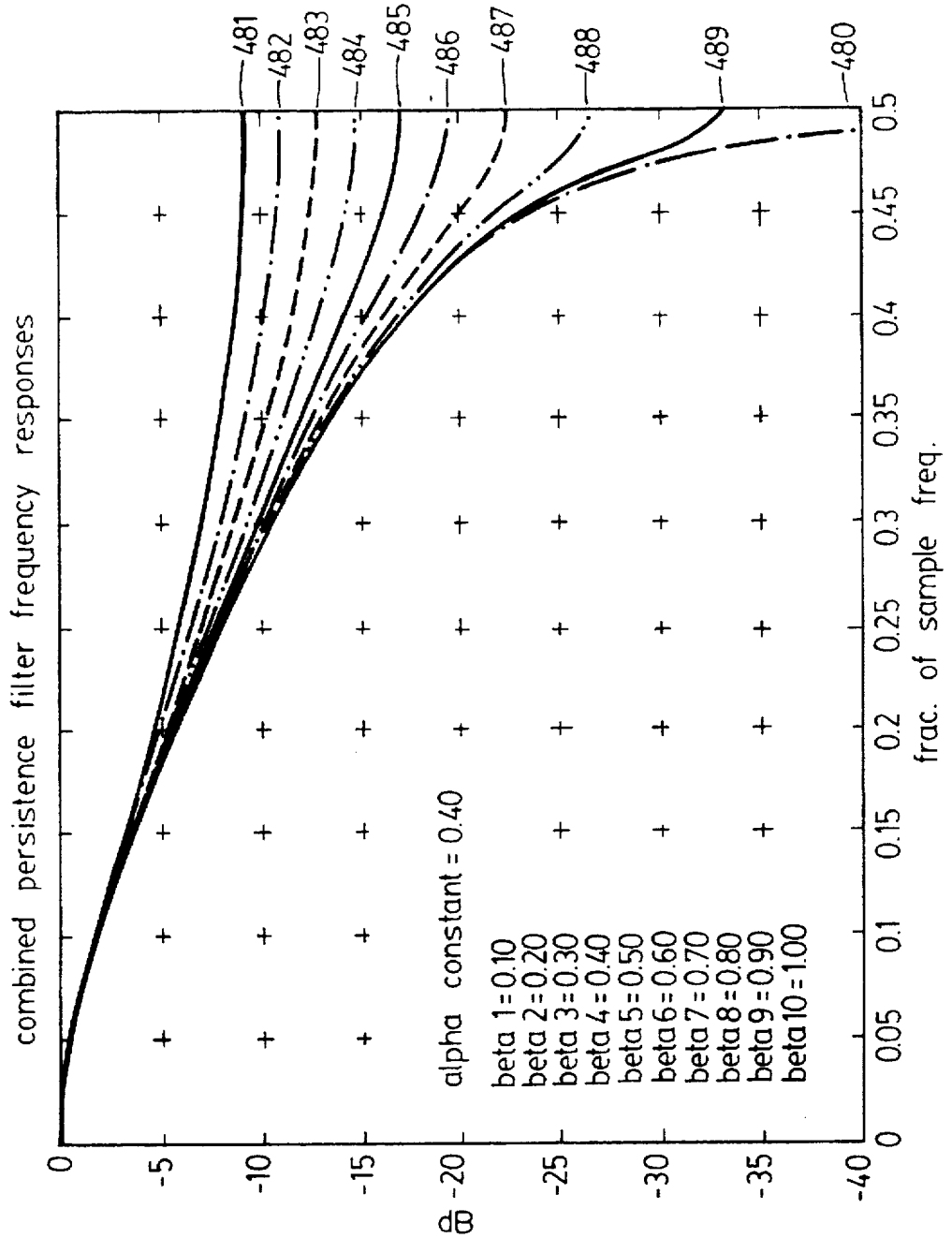
FIG._4H.

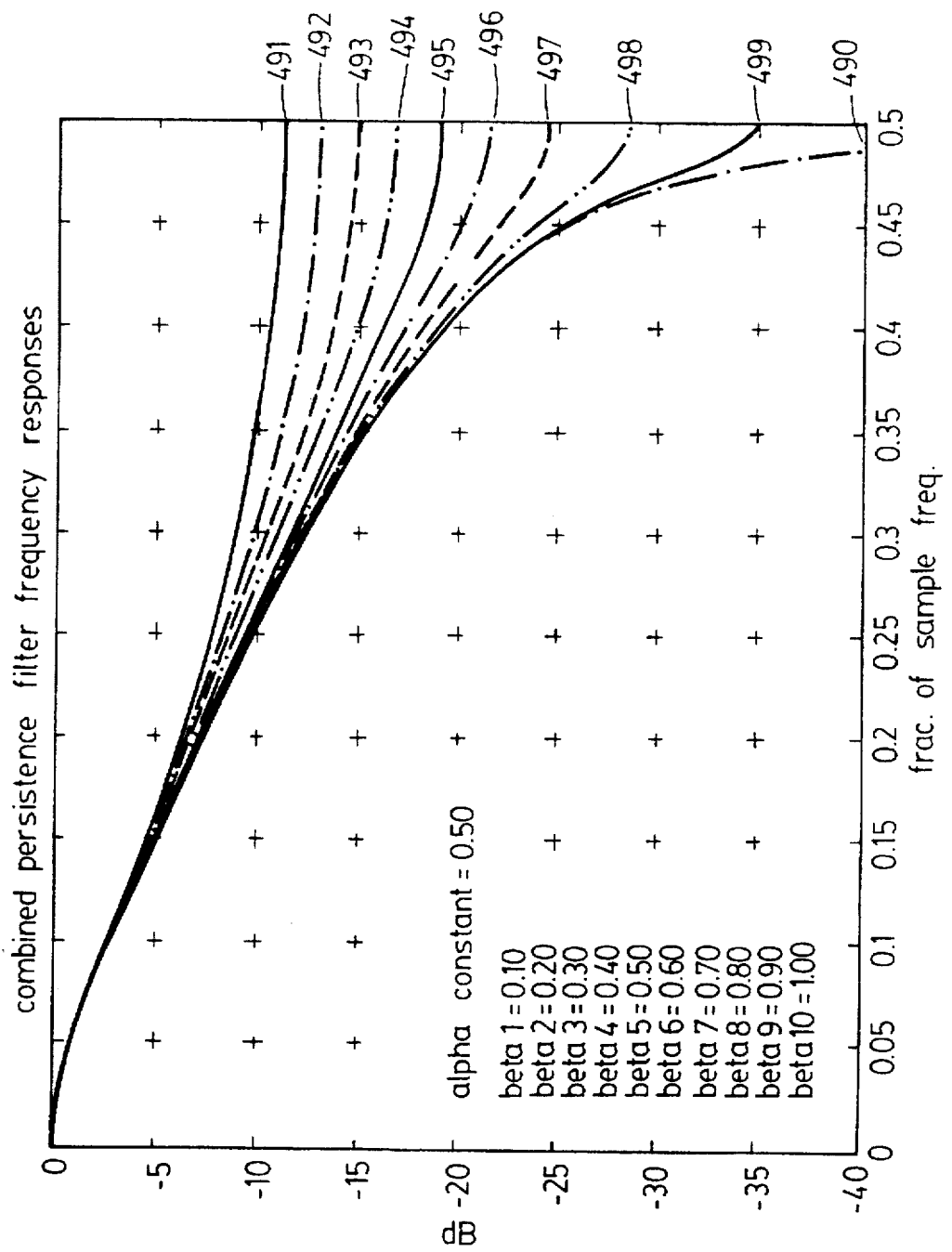
FIG._4I.

ADAPTIVE PERSISTENCE PROCESSING

This application is a continuation of application Ser. No. 08/433,217, filed May 2, 1995, and now U.S. Pat. No. 5,595,179.

BACKGROUND OF THE INVENTION

1. Field of the Invention

This invention relates to adaptive persistence processing in an ultrasound imaging system.

2. Description of Related Art

Ultrasound imaging systems generally operate by transmitting ultrasound signals from an ultrasound transducer or a plurality of transducer elements into a human body at a skin surface or within a body cavity, and receiving ultrasound signals reflected by objects or structures, such as organ tissue or other acoustic interfaces in a scan region (such as a scan plane), back to the ultrasound transducer.

Ultrasound images, like other images, are subject to noise which may affect the values of individual pixels. Ultrasound images, like some other images, display the effects of movement of the underlying object or objects being imaged. Ultrasound images, like some other images, suffer from the effects of temporal noise in the real-time image sequence. Simple filtering of this noise often has the untoward effect of blurring or degrading small structures, or the borders of structures, which are moving in the image field.

One method of the prior art is to use a single tap recursive filter which weights and sums corresponding pixel data from the previous display frame with pixel data from an input frame to generate each display frame; this is sometimes called "temporal filtering." In this method, a previous display frame's pixel would be averaged with an input frame's pixel, using a weighting value $\alpha$. The weighting value $\alpha$ is constant, thus applying an equal degree of temporal filtering to all pixels in the frame. Thus, this method is data independent, i.e., not adaptive to changes in the image data. While this method achieves the goal of temporal noise reduction, it has the drawback that it can blur those structures or borders of structures which are moving. More generally, this method comprises a persistence filter in which the amount of persistence applied is the same for all pixels in the image, whether those pixels represent fast-moving structures, slow-moving structures, or low-intensity (i.e., dimmer) structures.

U.S. Pat. No. 4,751,846, "Reducing Noise in Ultrasonic Images", issued Jun. 21, 1988, in the name of Bruno Dousse, and assigned to Kontron Holding, A. G., relates to time-discrete non-linear filtering with filter coefficients which vary as a function of the filter input signal. This patent shows a two-stage nonlinear temporal filter which varies the coefficients for each stage as a function of the amplitude of the filter input signal. The temporal filter adjusts the coefficients of the two stages to apply a larger degree of filtering for smaller amplitude (i.e., dimmer) input signals and a smaller degree of filtering for larger amplitude (i.e., brighter) input signals. Thus, it is responsive only to the amplitude of the image signal. While this method also achieves the goal of temporally filtering pixels, it has the drawback that it does not successfully discriminate between moving structures and noise, and can result in increased noise levels in brighter structures, while blurring dimmer structures.

U.S. Pat. No. 4,785,818, "Method and Means or Dynamically Weighted Temporal Averaging of Pixel Data", issued Nov. 22, 1988, in the name of William R. Hardin, and assigned to General Electric Company, relates to a filter responsive to the difference between successive values of a pixel. This patent shows a nonlinear recursive filter with a weighting factor $\alpha$, having only a single stage. In this patent, the weighting factor $\alpha$ varies as a function of the first difference between the current pixel value and the corresponding pixel value from the just-previous frame. The function is such that the greater the difference, the less persistence is applied, so that fast-moving structures and noise are persisted less than slow-moving structures. While this method also achieves the goal of temporally filtering pixels, it has the drawback that this filter topology can often force the designer to choose between (1) attenuation of a broad range of higher frequencies, resulting in blurring moving structures, and (2) reduced noise attenuation.

U.S. Pat. No. 4,887,306, "Adaptive Temporal Filter for Ultrasound Imaging System", issued Dec. 12, 1989, in the name of Juin-Jet Hwang, et al., and assigned to Advanced Technology Laboratories, relates to filtering a pixel series with a filter whose characteristic varies as the magnitude of the pixel signal varies. This patent shows a nonrecursive filter structure, in which the weighting value $\alpha$ is adjusted as a function of the amplitude of the current pixel value. The function is such that the greater the amplitude (i.e., the brighter the pixel), the less persistence is applied, based on a proffered concept that brighter echoes are from "strong specular reflectors," thus preferably not enhanced by persistence, while dimmer echoes are from "diffuse scatterers," and thus more favorably enhanced by persistence. While this method also achieves the goal of temporally filtering pixels, it has drawbacks similar to that of the method shown in U.S. Pat. Nos. 4,751,846 and 4,785,818.

SUMMARY OF THE INVENTION

The invention provides a method and system for adaptive persistence processing in an ultrasound imaging system. In a preferred embodiment, acoustic signals are temporally filtered using an adaptive persistence filter, having a recursive stage followed by a nonrecursive stage. A set of filtering coefficients for each stage are supplied by a look-up table in a memory, addressed or indexed in response to a plurality of input or output pixel values. The look-up table may therefore embody any selected function of its input variables. Preferably, the input variables for the look-up table function are a current input pixel value $X_n$ and a previous intermediate pixel value $W_{n-1}$, and the function embodied by the look-up table includes a relative first difference function $|X_n - W_{n-1}|/X_n$ (where $|x|$ is the absolute-value function) for selecting a filter coefficient.

In a preferred embodiment, a recursive filtering coefficient $\alpha$ is held constant over time, while a nonrecursive filtering coefficient $\gamma$ is adjusted dynamically in response to the current input pixel value $X_n$ and the previous intermediate pixel value $W_{n-1}$. Both the current input pixel value $X_n$ and the previous intermediate pixel value $W_{n-1}$ are used to generate the nonrecursive filter coefficient $\gamma$ so as to discriminate between moving structures and noise. The nonrecursive stage filter has a frequency response that attenuates higher frequency components without attenuating a broad range of lower frequency components, relative to the recursive stage frequency response. Also, the step response or settling time of the nonrecursive stage filter always spans one frame interval, independent of the nonrecursive filtering coefficient ($\gamma$) value, while the step response or settling time for the recursive stage filter is generally longer and is dependent on the recursive filtering coefficient ($\alpha$) value. Both of these characteristics of the nonrecursive stage tend to reduce blurring of moving structures compared to the recursive stage filter.

In a second preferred embodiment, the recursive stage comprises a constant filtering coefficient α which weights the previous intermediate pixel value $W_{n-1}$ and sums the result with the current pixel value $X_n$, to generate the new intermediate pixel value $W_n$. The previous intermediate pixel value $W_{n-1}$ and a current intermediate pixel value $W_n$ are coupled to a look-up table in a memory, which provides a weighted sum of the two. The weighting function may embody any selected function of the input values of the current intermediate pixel value $W_n$ and the previous intermediate pixel value $W_{n-1}$. Both the current intermediate pixel value $W_n$ and the previous intermediate pixel value $W_{n-1}$ are used to generate the output pixel value $Y_n$.

BRIEF DESCRIPTION OF THE DRAWINGS

FIG. 1 shows a block diagram of an ultrasound imaging system.

FIG. 2 shows a block diagram of an adaptive persistence filter.

FIG. 3 shows a block diagram of a second adaptive persistence filter.

FIGS. 4A through 4I show generated plots of filter characteristics of adaptive persistence filters.

DESCRIPTION OF THE PREFERRED EMBODIMENT

In the following description, a preferred embodiment of the invention is described with regard to preferred process steps and data structures. However, those skilled in the art would recognize, after perusal of this application, that embodiments of the invention may be implemented using a set of general purpose computers operating under program control, and that modification of a set of general purpose computers to implement the process steps and data structures described herein would not require invention or undue experimentation.

THE ULTRASOUND IMAGING SYSTEM

FIG. 1 shows a block diagram of an ultrasound imaging system.

Elements of the ultrasound imaging system are described herein with reference to adaptive persistence processing and insofar as they relate to adaptive persistence processing. Further information about ultrasound systems may be found by reference to the incorporated disclosures, by reference to "Digital Instrumentation of Diagnostic Medical Ultrasound", by Peter Fish (John Wiley & Sons 1990, 1992), or by reference to "Ultrasonic Bioinstrumentation", by Douglas A. Christensen (John Wiley & Sons 1988).

An ultrasound imaging system 100 comprises a probe comprising an ultrasound transducer array 110 having a set of transducer elements 111, for generating ultrasound acoustic signals 112 that are typically directed in a scan plane 113, typically behind a skin surface or in a body cavity such as in a human body. Although a two dimensional scan plane 113 is shown, the scan plane 113 may also comprise a three dimensional scan region, such as if the transducer elements 111 are disposed in a planar array.

The acoustic signals 112 are reflected by objects or structures 120 in the scan plane 113, and return to the transducer elements 111. The transducer elements 111 convert the reflected ultrasound acoustic signals 112 into a set of corresponding electrical signals 115, and transmit those electrical signals 115 to an ultrasound image processor 130. The ultrasound image processor 130 produces, in response to the electrical signals 115, a display signal 131, which it transmits to a display device 140 (such as a monitor) for display to, and viewing by, an operator.

In a preferred embodiment, the ultrasound image processor 130 comprises a set of upstream circuits 132, which receive the electrical signals 115 and generate an image data signal 133, an adaptive persistence filter 200, which receives the image data signal 133 and generates a filtered image signal 201, and a scan converter element 134, which receives the filtered image signal 201 and scan converts it to generate the display signal 131.

THE ADAPTIVE PERSISTENCE FILTER

FIG. 2 shows a block diagram of an adaptive persistence filter.

Filter Structure

An adaptive persistence filter 200 comprises an input port 201 coupled to a pixel value for a current input pixel value $X_n$. The input pixel value $X_n$ is coupled to a recursive stage 210, which produces a current intermediate pixel value $W_n$. The current intermediate pixel value $W_n$ is delayed by a delay 220, which delays the pixel value by one frame interval. The output of the delay 220 is the previous intermediate pixel value $W_{n-1}$. Thus, the current intermediate pixel value $W_n$ and the previous intermediate pixel value $W_{n-1}$ represent corresponding pixels in successive frames.

The previous intermediate pixel value $W_{n-1}$ is fed back to the recursive stage 210. The current intermediate pixel value $W_n$ and the previous intermediate pixel value $W_{n-1}$ are both also fed forward to a nonrecursive stage 230, which produces an output pixel value $Y_n$. A look-up table 240 provides a recursive filtering coefficient α to the recursive stage 210, and provides a nonrecursive filtering coefficient γ to the nonrecursive stage 230. The recursive filtering coefficient (α) is preferably a constant, while the nonrecursive filtering coefficient γ may vary as a function of the look-up table 240 inputs (the previous intermediate pixel value $W_{n-1}$ and the current input pixel value $X_n$).

In a preferred embodiment, the current input pixel value $X_n$, the current intermediate pixel value $W_n$, the previous intermediate pixel value $W_{n-1}$, the output pixel value $Y_n$, and indeed all pixel values used by the adaptive persistence filter 200, are represented by binary data values. The recursive filtering coefficient α and the nonrecursive filtering coefficient γ comprise values having similar representation.

The Recursive Stage

The recursive stage 210 receives the current input pixel value $X_n$ at the node 201, receives the previous intermediate pixel value $W_{n-1}$ at a node 211, receives the recursive filtering coefficient α at a node 212, and generates the current intermediate pixel value $W_n$ at a node 213, according to equation 251.

$$W_n = (1-\alpha)X_n + \alpha W_{n-1} = X_n + \alpha(W_{n-1} - X_n) \tag{251}$$

In a preferred embodiment, the current intermediate pixel value $W_n$ is determined by computing a difference between the previous intermediate pixel value $W_{n-1}$ and the current input pixel value $X_n$, multiplying a result of that difference computation by the recursive filtering coefficient α, and adding the current input pixel value $X_n$ to a result of that

5 multiplication computation, as shown in the recursive stage 210 block in FIG. 2.

The Nonrecursive Stage

The nonrecursive stage 230 receives the current intermediate pixel value $W_n$ at the node 213, receives the previous intermediate pixel value $W_{n-1}$ at the node 211, receives the nonrecursive filtering coefficient $\gamma$ at a node 231, and generates the output pixel value $Y_n$ at a node 232, according to equation 252.

$$Y_n=(1-\gamma)W_n+\gamma W_{n-1}=W_n+\gamma(W_{n-1}-W_n) \quad (252)$$

In a preferred embodiment, the output pixel value $Y_n$ is determined by computing a difference between the current intermediate pixel value $W_n$ and the previous intermediate pixel value $W_{n-1}$, multiplying a result of that difference computation by the nonrecursive filtering coefficient $\gamma$, and adding the current intermediate pixel value $W_n$ to a result of that multiplication computation, as shown in the nonrecursive stage 230 block in FIG. 2.

The Look-up Table

The look-up table 240 receives the current input pixel value $X_n$ at the node 201, receives the previous intermediate pixel value $W_{n-1}$ at the node 211, generates the recursive filtering coefficient $\alpha$ at the node 212, and generates the nonrecursive filtering coefficient $\gamma$ at a node 231. The nonrecursive filtering coefficient $\gamma$ is generated by addressing or indexing into a memory in response to its inputs, and reading its outputs in response to values stored in the memory.

The nature of the look-up table 240 is that the values of the recursive filtering coefficient $\alpha$ and the nonrecursive filtering coefficient $\gamma$ may be selected arbitrarily for each addressable location in memory. In a preferred embodiment, these values are selected as shown herein.

In a preferred embodiment, the recursive filtering coefficient $\alpha$ is held constant over time. The look-up table 240 thus comprises the same output value for $\alpha$ in each addressable location, regardless of the input values for the current input pixel value $X_n$ and the previous intermediate pixel value $W_{n-1}$.

In a preferred embodiment, the nonrecursive filtering coefficient $\gamma$ is adjusted dynamically in response to the current input pixel value $X_n$ and the previous intermediate pixel value $W_{n-1}$. The look-up table 240 thus comprises a set of differing output values for $\gamma$ in differing addressable locations, where $\gamma$ is a function of $|X_n-W_{n-1}|/X_n$ (where $|x|$ is the absolute-value function).

In a preferred embodiment, the values for $\gamma$ are computed and stored in the look-up table 240 prior to operation of the adaptive persistence filter 200. When the adaptive persistence filter 200 is in operation, the look-up table 240 operates by retrieving the pre-computed value from a memory location.

In a preferred embodiment, the look-up table 240 may comprise a RAM or a ROM memory. In embodiments where the look-up table 240 comprises RAM, that memory is preferably loaded from a long-term storage medium (such as a magnetic disk or an optical disk), or the values to be stored in that memory are computed by a processor and loaded, prior to operation of the adaptive persistence filter 200. In embodiments where the look-up table 240 comprises ROM, that memory is preferably written into prior to installation of the look-up table 240 component into the adaptive persistence filter 200.

Filter Characteristics

The transfer function for the recursive stage 210 is shown in equation 254.

$$H_1(z)=k_1/(1-\alpha z^{-1}), \quad (254)$$

where $H_1(z)$ is the transfer function of the recursive stage 210; and $$k_1=(1-\alpha), \quad -1 \leq \alpha < 1. \quad (255)$$

The transfer function for the nonrecursive stage 230 is shown in equation 256.

$$H_2(z)=k_2(1+\beta z^{-1}), \quad (256)$$

where $H_2(z)$ is the transfer function of the nonrecursive stage 230;

$$k_2=(1-\gamma), \quad -1 \leq \gamma < 1; \text{ and} \quad (257)$$

$$\beta=\gamma/(1-\gamma), \quad -0.5 \leq \beta < \infty. \quad (258)$$

Thus, the overall transfer function for the adaptive persistence filter 200 is shown in equation 259.

$$H(z)H_1(z)H_2(z)=k_1k_2(1+\beta z^{-1})/(1-\alpha z^{-1}), \quad (259)$$

where $H(z)$ is the transfer function of the adaptive persistence filter 200.

The nonrecursive stage filter has a frequency response that attenuates higher frequency components without attenuating a broad range of lower frequency components, relative to the recursive stage frequency response. Also, the step response or settling time of the nonrecursive stage filter always spans one frame interval, independent of the nonrecursive filtering coefficient ($\gamma$) value, while the step response or settling time for the recursive stage filter is generally longer and is dependent on the recursive filtering coefficient ($\alpha$) value. Both of these characteristics of the nonrecursive stage tend to reduce blurring of moving structures compared to the recursive stage filter.

Generality of the Filter

Those skilled in the art would recognize, after perusal of this application, that there are many variations of the filter described herein, and that modification of the parameters of the filter described herein to achieve such variations would not require either invention or undue experimentation.

For example, in alternative embodiments the nonrecursive stage 230 could be extended to implement image subtraction. In such alternative embodiments, the output pixel value $Y_n$ would be generated according to equation 400.

$$Y_n=|W_{n-1}-W_n| \quad (260)$$

In such alternative embodiments, $Y_n$ would be determined according to equation 260 in place of equation 252.

7

For a second example, in alternative embodiments α or γ may be set to negative values.

When $-1 \leq \alpha < 0$, the recursive stage 210 may perform high-pass filtering. However, in such alternative embodiments, the impulse response of the recursive stage 210 may be undesirable for imaging applications.

When $-1 \leq \beta < 0$ (see equation 258), the nonrecursive stage 230 may perform high-pass filtering. This may be useful in performing edge enhancement in some applications.

ALTERNATIVE ADAPTIVE PERSISTENCE FILTER

FIG. 3 shows a block diagram of a second adaptive persistence filter.

A second adaptive persistence filter 300 comprises an input port 301 coupled to a pixel value for the current input pixel value $X_n$. The input pixel value $X_n$ is coupled to a recursive stage 310, which produces a current intermediate pixel value $W_n$. The current intermediate pixel value $W_n$ is delayed by a delay 320, similar to the delay 220. The delay 320 delays the pixel value by one frame interval. The output of the delay 320 is the previous intermediate pixel value $W_{n-1}$. Thus, the current intermediate pixel value $W_n$ and the previous intermediate pixel value $W_{n-1}$ represent corresponding pixels in successive frames.

The previous intermediate pixel value $W_{n-1}$ is fed back to the recursive stage 310. The current intermediate pixel value $W_n$ and the previous intermediate pixel value $W_{n-1}$ are both also fed forward to a nonrecursive stage 330, which produces an output pixel value $Y_n$.

The Recursive Stage

The recursive stage 310 receives the current input pixel value $X_n$ at the node 301, receives the previous intermediate pixel value $W_{n-1}$ at a node 311, receives the recursive filtering coefficient α at a node 312, and generates the current intermediate pixel value $W_n$ at a node 313, according to equation 351.

$$W_n = X_n + \alpha W_{n-1} \quad (351)$$

The Nonrecursive Stage

The nonrecursive stage 330 receives the current intermediate pixel value $W_n$ at the node 313, receives the previous intermediate pixel value $W_{n-1}$ at the node 311, and generates the output pixel value $Y_n$ at a node 332. In a preferred embodiment, the output pixel value $Y_n$ is generated according to equation 352.

$$Y_n = (1-\gamma)W_n + \gamma W_{n-1} = W_n + \gamma(W_{n-1} - W_n), \quad (352)$$

where $\gamma = \beta/(1+\beta)$ as shown herein. (353)

The nonrecursive stage 330 comprises a look-up table 340, in which γ is an arbitrary function which may be varied adaptively as a function of the current intermediate pixel value $W_n$ and the previous intermediate pixel value $W_{n-1}$.

In a preferred embodiment, similar to the look-up table 240, the look-up table 340 may comprise a RAM or a ROM memory.

PLOTS OF FILTER CHARACTERISTICS

FIGS. 4A through 4I show generated plots of filter characteristics of adaptive persistence filters.

8

In each of FIGS. 4A through 4I, the X axis varies with a fraction of the sample frequency, or frame rate, and the Y axis varies with an amount of attenuation in dB.

FIG. 4A shows a plot of frequency responses for the nonrecursive stage of the adaptive persistence filter described herein, for various choices of β.

Table 4-1 shows corresponding curves and values for β.

TABLE 4-1

| Curve | Value for β |
|---|---|
| curve 411 | 0.10 |
| curve 412 | 0.20 |
| curve 413 | 0.30 |
| curve 414 | 0.40 |
| curve 415 | 0.50 |
| curve 416 | 0.60 |
| curve 417 | 0.70 |
| curve 418 | 0.80 |
| curve 419 | 0.90 |
| curve 410 | 1.00 |

FIG. 4B shows a plot of frequency responses for the recursive stage of the adaptive persistence filter described herein, for various choices of α.

Table 4-2 shows corresponding curves and values for α.

TABLE 4-2

| Curve | Value for α |
|---|---|
| curve 421 | 0.10 |
| curve 422 | 0.20 |
| curve 423 | 0.30 |
| curve 424 | 0.40 |
| curve 425 | 0.50 |
| curve 426 | 0.60 |
| curve 427 | 0.70 |
| curve 428 | 0.80 |
| curve 429 | 0.90 |

FIG. 4C shows a plot of step responses for the nonrecursive stage of the adaptive persistence filter described herein, for various choices of β.

Table 4-3 shows corresponding curves and values for β.

TABLE 4-3

| Curve | Value for β |
|---|---|
| curve 431 | 0.10 |
| curve 432 | 0.20 |
| curve 433 | 0.30 |
| curve 434 | 0.40 |
| curve 435 | 0.50 |
| curve 436 | 0.60 |
| curve 437 | 0.70 |
| curve 438 | 0.80 |
| curve 439 | 0.90 |
| curve 430 | 1.00 |

FIG. 4D shows a plot of step responses for the recursive stage of the adaptive persistence filter described herein, for various choices of α.

Table 4-4 shows corresponding curves and values for α.

TABLE 4-4

| Curve | Value for α |
| --- | --- |
| curve 441 | 0.10 |
| curve 442 | 0.20 |
| curve 443 | 0.30 |
| curve 444 | 0.40 |
| curve 445 | 0.50 |
| curve 446 | 0.60 |
| curve 447 | 0.70 |
| curve 448 | 0.80 |
| curve 449 | 0.90 |

FIG. 4E shows a plot of frequency responses for the combined adaptive persistence filter described herein, for various choices of β, with a constant α=0.10.

Table 4-5 shows corresponding curves and values for β.

TABLE 4-5

| Curve | Value for β |
| --- | --- |
| curve 451 | 0.10 |
| curve 452 | 0.20 |
| curve 453 | 0.30 |
| curve 454 | 0.40 |
| curve 455 | 0.50 |
| curve 456 | 0.60 |
| curve 457 | 0.70 |
| curve 458 | 0.80 |
| curve 459 | 0.90 |
| curve 450 | 1.00 |

FIG. 4F shows a plot of frequency responses for the combined adaptive persistence filter described herein, for various choices of β, with a constant α=0.20.

Table 4-6 shows corresponding curves and values for β.

TABLE 4-6

| Curve | Value for β |
| --- | --- |
| curve 461 | 0.10 |
| curve 462 | 0.20 |
| curve 463 | 0.30 |
| curve 464 | 0.40 |
| curve 465 | 0.50 |
| curve 466 | 0.60 |
| curve 467 | 0.70 |
| curve 468 | 0.80 |
| curve 469 | 0.90 |
| curve 460 | 1.00 |

FIG. 4G shows a plot of frequency responses for the combined adaptive persistence filter described herein, for various choices of β, with a constant α=0.30.

Table 4-7 shows corresponding curves and values for β.

TABLE 4-7

| Curve | Value for β |
| --- | --- |
| curve 471 | 0.10 |
| curve 472 | 0.20 |
| curve 473 | 0.30 |
| curve 474 | 0.40 |
| curve 475 | 0.50 |
| curve 476 | 0.60 |
| curve 477 | 0.70 |
| curve 478 | 0.80 |

TABLE 4-7-continued

| Curve | Value for β |
| --- | --- |
| curve 479 | 0.90 |
| curve 470 | 1.00 |

FIG. 4H shows a plot of frequency responses for the combined adaptive persistence filter described herein, for various choices of β, with a constant α=0.40.

Table 4-8 shows corresponding curves and values for β.

TABLE 4-8

| Curve | Value for β |
| --- | --- |
| curve 481 | 0.10 |
| curve 482 | 0.20 |
| curve 483 | 0.30 |
| curve 484 | 0.40 |
| curve 485 | 0.50 |
| curve 486 | 0.60 |
| curve 487 | 0.70 |
| curve 488 | 0.80 |
| curve 489 | 0.90 |
| curve 480 | 1.00 |

FIG. 4I shows a plot of frequency responses for the combined adaptive persistence filter described herein, for various choices of β, with a constant α=0.50.

Table 4-9 shows corresponding curves and values for β.

TABLE 4-9

| Curve | Value for β |
| --- | --- |
| curve 491 | 0.10 |
| curve 492 | 0.20 |
| curve 493 | 0.30 |
| curve 494 | 0.40 |
| curve 495 | 0.50 |
| curve 496 | 0.60 |
| curve 497 | 0.70 |
| curve 498 | 0.80 |
| curve 499 | 0.90 |
| curve 490 | 1.00 |

Alternative Embodiments

Although preferred embodiments are disclosed herein, many variations are possible which remain within the concept, scope, and spirit of the invention, and these variations would become clear to those skilled in the art after perusal of this application.

For example, although a preferred embodiment of the invention is described with regard to a pre-scan-conversion ultrasound image, the invention and the disclosure herein are equally applicable to a post-scan-conversion ultrasound image. In such an alternative embodiment, the adaptive persistence filter would be combined with a display memory to record and filter post-scan-conversion image data, so as to provide an adaptively persistence post-scan-conversion ultrasound image.

For a second example, although a preferred embodiment of the invention is described with a single recursive stage and a single nonrecursive stage, alternative embodiments could comprise a plurality of recursive stages, or a plurality of nonrecursive stages, or both. In such alternative embodiments, the coefficients for each of the recursive stages and nonrecursive stages could be varied either in tandem or independently.

We claim:

1. An adaptive persistence filter in an ultrasound imaging system, the filter comprising:
   a first stage filter selected from the group of: recursive and nonrecursive filters comprising a first input and a first output and responsive to a substantially constant filtering coefficient; and
   a second stage filter selected from the group of: recursive and nonrecursive filters operatively connected to the first output and responsive to a dynamic filtering coefficient.

2. The filter of claim 1 wherein the substantially constant filtering coefficient is substantially constant for the time required to process one set of signals.

3. The filter of claim 1 wherein the first stage filter is a recursive stage filter.

4. The filter of claim 3 wherein the second stage filter is a nonrecursive stage filter.

5. The filter of claim 3 further comprising:
   a delay operatively connected to the first output;
   a second input to the first stage filter operatively connected to the delay.

6. The filter of claim 1 wherein the second stage filter is a nonrecursive stage filter.

7. The filter of claim 1 wherein the dynamic filtering coefficient is responsive to a signal selected from the group of signals at: the first input, the first output, and a delayed first output.

8. The filter of claim 1 wherein the dynamic filtering coefficient is responsive to at least two signals selected from the group of signals at: the first input, the first output, and a delayed first output.

9. The filter of claim 8 wherein the dynamic filtering coefficient is responsive to a first signal at the first input and a second signal at the delayed first output.

10. The filter of claim 8 wherein the dynamic filtering coefficient is responsive to a first signal at the first output and a second signal at the delayed first output.

11. The filter of claim 1 further comprising a function block for providing the dynamic filtering coefficient.

12. The filter of claim 11 wherein the function block further provides the substantially constant filtering coefficient.

13. The filter of claim 11 wherein the function block comprises a look-up table memory, a first function block input operatively connected to the first input, and a second function block input operatively connected to a delayed first output.

14. The filter of claim 1 wherein a transfer function $H(z)$ of said filter comprises a term $k_1 k_2(1+\beta z^{-1})/(1-\alpha z^{-1})$ wherein: $k_1=(1-\alpha)$, $k_2=(1-\gamma)$, $\beta=\gamma/(1-\gamma)$, $\gamma$ is the dynamic filtering coefficient, and $\alpha$ is the substantially constant filtering coefficient.

15. The filter of claim 1 wherein the dynamic filtering coefficient is adjusted in response to a function of an absolute value of a signal at the first input minus a delayed first output signal.

16. The filter of claim 1 wherein a difference between a first signal at the first input and a second signal delayed from the first output is multiplied by the substantially constant filtering coefficient.

17. The filter of claim 1 wherein a difference between a first signal at the first output and a second signal delayed from the first output is multiplied by the dynamic filtering coefficient.

18. A method of adaptive persistence filtering in an ultrasound imaging system, the method comprising the steps of:
   receiving an input signal;
   filtering the input signal with a first stage filter selected from the group of: recursive and nonrecursive filters responsive to a substantially constant filtering coefficient; and
   filtering an output signal from the first stage filter with a second stage filter selected from the group of: recursive and nonrecursive filters responsive to a dynamic filtering coefficient.

19. The method of claim 18 further comprising the step of adjusting the dynamic filtering coefficient in response to a signal selected from the group of: the input signal, the output signal and a delayed output signal.

20. The method of claim 19 wherein the step of adjusting comprises obtaining the dynamic filtering coefficient from a memory.

21. The method of claim 19 wherein the step of adjusting comprises adjusting the dynamic filtering coefficient as a function of an absolute value of the input signal minus the delayed output signal.

22. The method of claim 18 further comprising the step of adjusting the dynamic filtering coefficient in response to at least two signals selected from the group of: the input signal, the output signal and a delayed output signal.

23. The method of claim 22 wherein the step of adjusting comprises adjusting the dynamic filtering coefficient in response to the input signal and the delayed output signal.

24. The method of claim 22 wherein the step of adjusting comprises adjusting the dynamic filtering coefficient in response to the output signal and the delayed output signal.

25. The method of claim 18 further comprising the step of generating a delayed output signal corresponding to a previous output signal from the first stage filter.

26. The method of claim 18 wherein the step of filtering the input signal comprises the steps of:
   calculating a difference between the input signal and a delayed output signal; and
   multiplying the difference by the substantially constant filtering coefficient.

27. The method of claim 18 wherein the step of filtering an output signal comprises the steps of:
   calculating a difference between the output signal and a delayed output signal; and
   multiplying the difference by the dynamic filtering coefficient.

28. An adaptive persistence filter in an ultrasound imaging system, the filter comprising:
   a first stage filter selected from the group of: recursive and nonrecursive filters comprising a first input and a first output and responsive to a first filtering coefficient;
   a second stage filter selected from the group of: recursive and nonrecursive filters operatively connected to the first output and responsive to a dynamic filtering coefficient; and
   the dynamic filtering coefficient responsive to at least two signals selected from the group of signals at: the first input, the first output, and a delayed first output.

29. The filter of claim 28 wherein the first filtering coefficient is substantially constant.

30. The filter of claim 28 wherein the first stage filter is a recursive stage filter.

31. The filter of claim 30 wherein the second stage filter is a nonrecursive stage filter.

32. The filter of claim 30 further comprising:
   a delay operatively connected to the first output;

a second input to the first stage filter operatively connected to the delay.

33. The filter of claim 28 wherein the second stage filter is a nonrecursive stage filter.

34. The filter of claim 28 wherein the dynamic filtering coefficient is responsive to the first input signal and the delayed first output signal.

35. The filter of claim 28 wherein the dynamic filtering coefficient is responsive to the first output signal and the delayed first output signal.

36. The filter of claim 28 further comprising a function block for providing the dynamic filtering coefficient.

37. The filter of claim 36 wherein the function block comprises a look-up table memory, a first function block input operatively connected to the first input, and a second function block input operatively connected to the delayed first output.

38. The filter of claim 28 wherein a transfer function H(z) of said filter comprises a term $k_1 k_2(1+\beta z^{-1})/(1-\alpha z^{-1})$ wherein: $k_1=(1-\alpha)$, $k_2=(1-\gamma)$, $\beta=\gamma/(1-\gamma)$, $\gamma$ is the dynamic filtering coefficient, and $\alpha$ is the first filtering coefficient.

39. The filter of claim 28 wherein the dynamic filtering coefficient is adjusted dynamically in response to a function of an absolute value of a first signal at the first input minus a second signal at the delayed first output.

40. The filter of claim 28 wherein a difference between a first signal at the first input and a second signal at the delayed first output is multiplied by the first filtering coefficient.

41. The filter of claim 28 wherein a difference between a first signal at the first output and a second signal at the delayed first output is multiplied by the dynamic filtering coefficient.

42. A method of adaptive persistence filtering in an ultrasound imaging system, the method comprising the steps of:

receiving an input signal;

filtering said input signal with a first stage filter selected from the group of: recursive and nonrecursive filters responsive to a first filtering coefficient;

filtering an output signal from the first stage filter with a second stage filter selected from the group of: recursive and nonrecursive filters responsive to a dynamic filtering coefficient; and adjusting the dynamic filtering coefficient in response to at least two signals selected from the group of: the input signal, the output signal and a delayed output signal.

43. The method of claim 42 wherein the step of adjusting comprises adjusting the dynamic filtering coefficient in response to the input signal and the delayed output signal.

44. The method of claim 42 wherein the step of adjusting comprises adjusting the dynamic filtering coefficient in response to the output signal and the delayed output signal.

45. The method of claim 42 further comprising the step of providing the delayed output signal as a second input signal to the first stage filter.

46. The method of claim 42 further comprising the step of providing the first filtering coefficient and the dynamic filtering coefficient with a memory operatively connected to the at least two signals.

47. The method of claim 46 wherein the step of providing comprises providing a substantially constant first filtering coefficient.

48. The method of claim 42 wherein the step of adjusting comprises adjusting the dynamic filtering coefficient as a function of an absolute value of the input signal minus the delayed output signal.

49. The method of claim 42 wherein the step of filtering the input signal comprises the steps of:

calculating a difference between the input signal and the delayed output signal; and multiplying the difference by the first filtering coefficient.

50. The method of claim 42 wherein the step of filtering an output signal comprises the steps of:

calculating a difference between the output signal and the delayed output signal; and multiplying the difference by the dynamic filtering coefficient.

* * * * *

UNITED STATES PATENT AND TRADEMARK OFFICE
CERTIFICATE OF CORRECTION

PATENT NO. : 5,788,635
DATED : August 4, 1998
INVENTOR(S) : J. Nelson Wright et al.

It is certified that error appears in the above-indentified patent and that said Letters Patent is hereby corrected as shown below:

On the Title Page line 15, under "ABSTRACT", change "γis" to --γ is--.

page 2, line 2, under "OTHER PUBLICATIONS", change "Moldeled" to --Modeled--.

Signed and Sealed this

Twenty-ninth Day of February, 2000

Attest:

Q. TODD DICKINSON

Attesting Officer     Commissioner of Patents and Trademarks